(12) United States Patent
Seberger

(10) Patent No.: US 10,297,936 B2
(45) Date of Patent: May 21, 2019

(54) ELECTRICAL TERMINAL HAVING A CAGE CLAMP FOR WIRE TERMINATION

(71) Applicant: Fisher Controls International LLC, Marshalltown, IA (US)

(72) Inventor: Stephen George Seberger, Marshalltown, IA (US)

(73) Assignee: Fisher Controls International LLC, Marshalltown, IA (US)

( * ) Notice: Subject to any disclaimer, the term of this patent is extended or adjusted under 35 U.S.C. 154(b) by 0 days.

(21) Appl. No.: 15/792,543

(22) Filed: Oct. 24, 2017

(65) Prior Publication Data
US 2019/0123461 A1   Apr. 25, 2019

(51) Int. Cl.
| H01R 11/03 | (2006.01) |
| H01R 12/58 | (2011.01) |
| H01R 4/50 | (2006.01) |
| H05K 3/40 | (2006.01) |
| H01R 13/20 | (2006.01) |
| H01R 12/72 | (2011.01) |

(52) U.S. Cl.
CPC .......... *H01R 12/585* (2013.01); *H01R 4/505* (2013.01); *H01R 4/5091* (2013.01); *H01R 13/20* (2013.01); *H05K 3/403* (2013.01); *H01R 12/721* (2013.01); *H05K 2201/09145* (2013.01)

(58) Field of Classification Search
CPC .... H01R 12/585; H01R 13/514; H01R 13/20; H01R 24/78; H01R 4/505; H01R 4/5091; H01R 12/721; H05K 3/403; H05K 2201/09145

USPC ......................................................... 439/791
See application file for complete search history.

(56) References Cited

U.S. PATENT DOCUMENTS

| 7,806,729 | B2 * | 10/2010 | Nguyen | ............... | H01R 13/514 |
| | | | | | 439/607.23 |
| 9,450,356 | B1 * | 9/2016 | Wu | ......................... | H01R 24/78 |
| 9,608,348 | B2 | 3/2017 | Wanha et al. | | |
| 2002/0123266 | A1 * | 9/2002 | Ramey | .................. | H01R 12/585 |
| | | | | | 439/607.05 |
| 2017/0365943 | A1 * | 12/2017 | Wanha | ............... | H01R 13/6471 |

OTHER PUBLICATIONS

Phoenix Contact; Data sheet; PCB terminal block; Phoenix Contact GmbH & Co. KG; Copyright Phoenix Contact 2017; 13 pages; at least as early as Jan. 1, 2018.
Phoenix Contact; PCB terminal block; product sheet overview; Copyright 2018 Phoenix Contact; retrieved from the internet <https://www.phoenixcontact.com/online/portal/us?uri=pxc-oc-itemdetail:pid=1705469&library=usen&tab=1>; 2 pages; at least as early as Jan. 1, 2018.

(Continued)

*Primary Examiner* — Jean F Duverne
(74) *Attorney, Agent, or Firm* — Quarles & Brady LLP

(57) ABSTRACT

Embodiments of the invention provide an electrical terminal that provides wire termination at an edge of a printed circuit board. The electrical terminal includes a terminal body having a first corner, a cage clamp in the terminal body and defining a wire insert axis and a screw insert axis, and a base supporting the terminal body on the printed circuit board. The base is angled so that the first corner is aligned along a front plane defined along the edge of the printed circuit board.

20 Claims, 3 Drawing Sheets

(56) References Cited

OTHER PUBLICATIONS

Digi-Key Electronics; Eurostyle terminal block connectors; product sheet; Copyright 1995-2018 Digi-Key Electronics; retrieved from the internet <https://www.digikey.com/en/product-highlight/t/te-connectivity-amp/eurostyle-terminal-block-connectors>; 2 pages; at least as early as Jan. 1, 2018.

Amphenol Pcd; ELMP terminal block specification drawing; retrieved from the internet; <http://amphenolpcd.com/sites/default/files/product-docs/ELMP03051_C.pdf>: 1 page; at least as early as Jan. 1, 2018.

\* cited by examiner

ELECTRICAL TERMINAL HAVING A CAGE CLAMP FOR WIRE TERMINATION

BACKGROUND

Electrical terminals typically provide an electrical connection between two or more components. For example, electrical terminals can facilitate the connecting of a wire to other wires or electrical circuits connected to the electrical terminal. In some electrical terminal configurations, a cage clamp can be implemented to provide wire termination. That is, a cage clamp can secure a bare, or stripped, end of a wire within an electrical terminal to facilitate a connection to other electrical components. Conventional cage clamp designs generally include an electrically conductive clamp that can be manually actuated, for example, by a screw.

SUMMARY

Embodiments of the invention relate generally to electrical connectors and, more specifically, to an electrical terminal having a cage clamp for wire termination.

Some embodiments of the invention provide an electrical terminal that provides wire termination at an edge of a printed circuit board. The electrical terminal includes a terminal body having a first corner, a cage clamp that is in the terminal body and that defines a wire insert axis and a screw insert axis, and a base that supports the terminal body on the printed circuit board. The base is angled so that the first corner is aligned along a front plane defined along the edge of the printed circuit board.

Other embodiments of the invention provide an electrical terminal that provides wire termination at an edge of a card cage. The card cage includes a first printed circuit board and a second printed circuit board that is arranged above the first printed circuit board. The electrical terminal includes a terminal body, a cage clamp that is in the terminal body and that defines a wire insert axis and a screw insert axis, and a base that supports the terminal body on the first printed circuit board. The base is angled so that the screw insert axis is at an acute angle relative to a front plane that is defined along the edge of the card cage.

DETAILED DESCRIPTION

Figure 1:
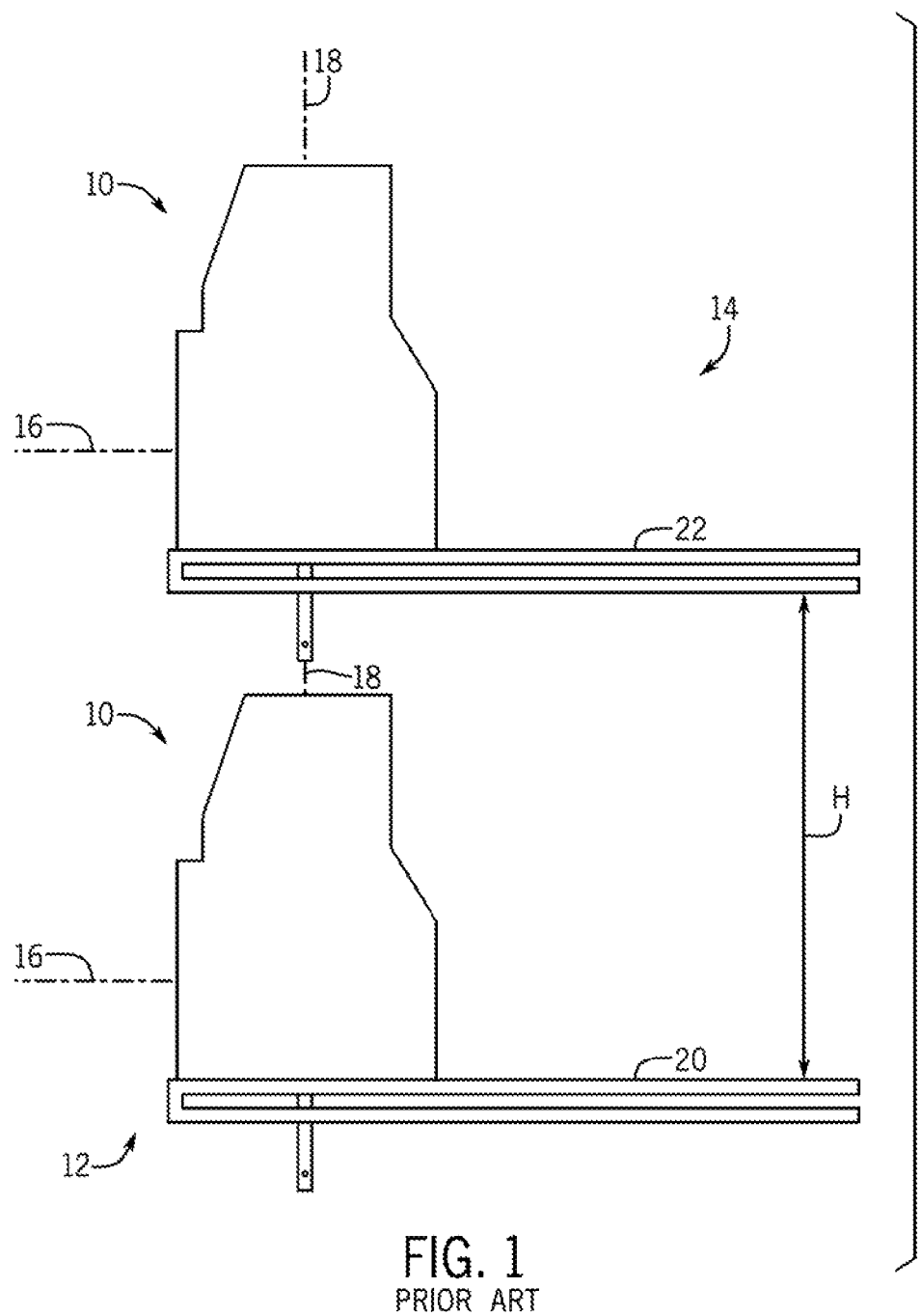
FIG. 1 is a side view of a card cage including electrical terminals according to the prior art.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

The following discussion is presented to enable a person skilled in the art to make and use embodiments of the invention. Various modifications to the illustrated embodiments will be readily apparent to those skilled in the art, and the generic principles herein can be applied to other embodiments and applications without departing from embodiments of the invention. Thus, embodiments of the invention are not intended to be limited to embodiments shown, but are to be accorded the widest scope consistent with the principles and features disclosed herein. The following detailed description is to be read with reference to the figures, in which like elements in different figures have like reference numerals. The figures, which are not necessarily to scale, depict selected embodiments and are not intended to limit the scope of embodiments of the invention. Skilled artisans will recognize the examples provided herein have many useful alternatives and fall within the scope of embodiments of the invention.

Current electrical terminal designs that are used, for example, in a card cage, fail to provide sufficient access for a user to terminate a wire within a cage clamp of the electrical terminal. For example, FIG. 1 illustrates an electrical terminal 10 installed at an edge 12 of a card cage 14 according to the prior art. The electrical terminal 10 includes a cage clamp to facilitate termination of a wire inserted into the cage clamp. The cage clamp is configured to receive a stripped end of a wire along a wire insert axis 16 and secure the wire within the cage clamp upon tightening of a screw arranged along a screw insert axis 18. For example, a screwdriver can be inserted along the screw insert axis 18 to tighten a screw, which results in tightening the cage clamp around the stripped end of the wire.

As illustrated in FIG. 1, the card cage 14 can include a first printed circuit board 20 and a second printed circuit board 22 arranged above the first printed circuit board 20. One or more of the electrical terminals 10 can be arranged at the edge 12 of each of the first and second printed circuit boards 20 and 22 in the card cage 14. The electrical terminal 10 according to the prior art defines a wire insert axis 16 that can be accessible from the edge 12 between a first printed circuit board 20 and the second printed circuit board 22. However, the screw insert axis 18 is not accessible from the edge 12, because the screw insert axis 18 is blocked by the second printed circuit board 22. Thus, in order to provide access, for example, to insert a screwdriver along the screw insert axis 18, the second printed circuit board 22 must be removed. Removing the second printed circuit board 22 each time that it is desired to terminate a wire, or remove a terminated wire, results in inefficiencies during installation and maintenance of the card cage 14.

Generally, embodiments of the invention provide an electrical terminal configured to provide wire termination at an edge of a printed circuit board, or card cage, and provide improved access to a wire insert axis and a screw insert axis. In this regard, embodiments of the invention provide an electrical terminal that includes a body configured to angle a screw insert axis and a wire insert axis so that they are accessible from an edge of the printed circuit board or card cage. In this way, for example, the electrical terminal enables a wire to be terminated or a terminated wire to be removed without requiring adjacent printed circuit boards be removed, which increases efficiency and decreases labor costs associated with installation and maintenance of the electrical terminal and/or the printed circuit board.

Figure 2:
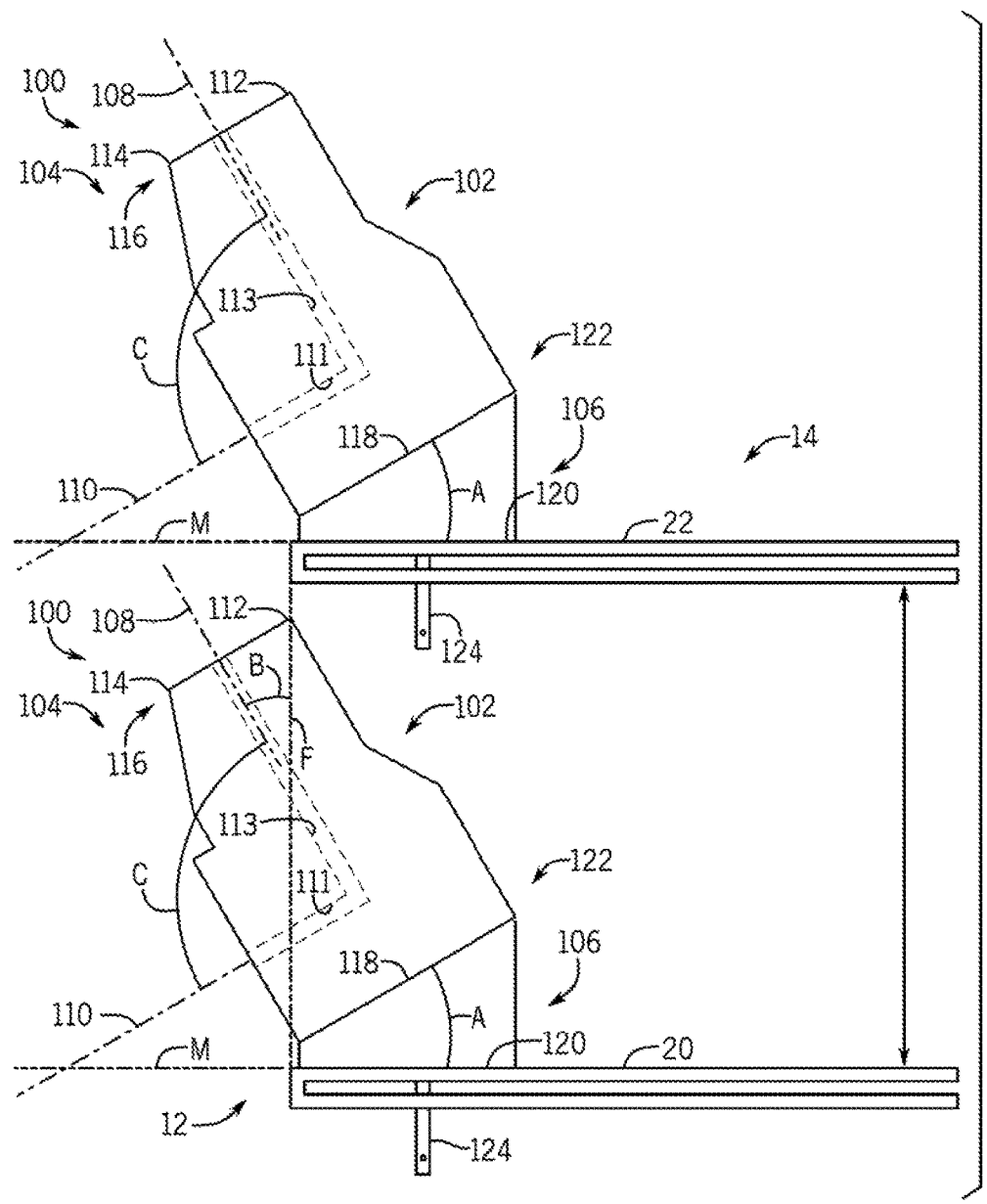
FIG. 2 is a side view of a card cage including electrical terminals having perpendicularly angled cage clamps according to one embodiment of the invention.

FIG. 2 illustrates an electrical terminal 100 according to one embodiment of the invention. In some embodiments, the electrical terminal 100 can provide wire termination at an edge of a printed circuit board. For example, one or more of the electrical terminals 100 can be arranged at the edge 12 of the first printed circuit board 20 or the second printed circuit board 22. In some embodiments, the electrical terminal 100 can provide wire termination at an edge of a card cage. For example, one or more of the electrical terminals 100 can be arranged at the edge 12 of the card cage 14. In the illustrated embodiment, the card cage 14 includes the first printed circuit board 20 and the second printed circuit board 22 arranged above the first printed circuit board 20. In other embodiments, for example, the card cage 14 can include more than two printed circuit boards in a stacked arrangement.

The electrical terminal 100 includes a terminal body 102, a cage clamp 104, and a base 106. The cage clamp 104 can be arranged within the terminal body 102 and can define a screw insert axis 108 and a wire insert axis 110. The cage clamp 104 can selectively terminate a wire within the terminal body 102 to provide electrical communication between the wire and, for example, the first printed circuit board 20. The cage clamp 104 can define a wire passage 111 along which a stripped end of a wire can be inserted into the terminal body 102. The wire insert axis 110 can be aligned along a centerline define by the wire passage 111 of the cage clamp 104. To facilitate securing, or clamping, the stripped end of a wire within the cage clamp 104, a screw can be arranged along a threaded screw passage 113 defined by the cage clamp 104. The screw insert axis 108 can be aligned along a centerline defined by the threaded screw passage 113. In some embodiments, for example, a screwdriver can be inserted along the screw insert axis 108 to tighten the screw, which can directly engage the stripped end of a wire or manipulate a clamping mechanism coupled to the screw.

In the illustrated embodiment, the terminal body 102 includes a first corner 112 and a second corner 114 at a distal end 116 of the terminal body 102. The screw insert axis 108 can extend into the terminal body 102 in between the first corner 112 and the second corner 114. When the electrical terminal 100 is arranged to provide wire termination at the edge 12 of, for example, the first printed circuit board 20 in the card cage 14, the first corner 112 and the second corner 114 can be arranged adjacent to the second printed circuit board 22. However, the design of the electrical terminal 100 and, in particular, the base 106 and the first and second corners 112 and 114 can be moved so that a user can access the screw insert axis 108 without interference from the second printed circuit board 22.

The base 106 includes an angled surface 118 and a mounting surface 120. The angled surface 118 is positioned at an angle A relative to the mounting surface 120. In some embodiments, for example, the angle A can be an acute angle. The use of the term "acute angle" herein is a term that refers to an angle that is less than ninety degrees and greater than zero degrees. That is, an acute angle can refer to an angle between one degree and eighty-nine degrees. In other embodiments, the angle A can be between twenty degrees and seventy degrees, or between thirty degrees and sixty degrees. In general, the angled surface 118 is configured to support the terminal body 102. Specifically, the angled surface 118 is coupled to, or in engagement with, a proximal end 122 of the terminal body 102. The mounting surface 120 is configured to engage, for example, the first printed circuit board 20 to facilitate the mounting of the electrical terminal 100 adjacent to the edge 12. A mounting plane M can be defined along an interface between the mounting surface 120 of the base 106 and, for example, the first printed circuit board 20.

In some embodiments, for example, the base 106 can be fabricated from a solid piece of material. In some embodiments, for example, the base 106 can include one or more slots extending therethrough to provide access, or space, between the base 106 and, for example, the first printed circuit board 20.

In some embodiments, the terminal body 102 and the base 106 can be formed as a single component. In other embodiments, the terminal body 102 and the base 106 can be formed as separable components. In these embodiments, the terminal body 102 and the base 106 can be coupled together before installation. For example, the terminal body 102 and the base 106 can be joined by an adhesive, a quick-disconnect mechanism, or a press-fit connection. In some embodiments, the terminal body 102 and/or the base 106 can be fabricated from a plastic material. In other embodiments, the terminal body 102 and/or the base 106 can be fabricated from a phenolic material.

In the illustrated embodiment, one or more pins 124 can extend from the base 106 toward, for example, the first printed circuit board 20. Generally, the pins 124 provide electrical communication between the cage clamp 104 and, for example, the first printed circuit board 20. That is, the pins 124 can electrically connect a terminated wire within the cage clamp 104 and, for example, the first printed circuit board 20. In some embodiments, the pins 124 can extend through the base 106 and electrically connect to at least a portion of the cage clamp 104 within the terminal body 102.

A front plane F can be defined along the edge 12 of the card cage 14. That is, the front plane F can extend along a plane defined by the edge 12 of the first printed circuit board 20 and the second printed circuit board 22. Generally, the front plane F can define a threshold beyond which it can be difficult to access either the screw insert axis 108 and/or the wire insert axis 110 during wire termination or removal of a terminated wire. That is, in a direction from the edge 12 into the space between the first printed circuit board 20 and the second printed circuit board 22.

The base 106 and, in particular, the angled surface 118 can provide easy access to both the screw insert axis 108 and the wire insert axis 110 to facilitate wire termination or the removal of a terminated wire, which negates the need to remove, for example, the second printed circuit board 22. For example, the angled surface 118 of the base 106 can arrange the screw insert axis 108 at an acute angle relative to the front plane F. In other words, an angle B defined between the screw insert axis 108 and the front plane F can be an acute angle. Arranging the screw insert axis 108 at an acute angle relative to the front plane F can ensure, for example, that a screwdriver can be inserted along the screw insert axis 108 without removing the second printed circuit board 22.

In some embodiments, the angled surface 118 of the base 106 can align the first corner 112 along the front plane F. In this way, for example, the design of the base 106 can ensure that the screw insert axis 108, which extends between the first corner 112 and the second corner 114, is clear of (i.e., does not intersect) the second printed circuit board 22. Thus, the arrangement of the screw insert axis 108 provided by the angled surface 118 of the base 106 can ensure, for example, that a screwdriver can be inserted along the screw insert axis 108 without removing the second printed circuit board 22.

In some embodiments, for example, the angled surface 118 of the base 106 angles the wire insert axis 110 so that the wire insert axis 110 extends from the terminal body 102 and intersects the mounting plane M. In other words, as the wire insert axis 110 extends in a direction away from the terminal body 102, the wire insert axis 110 eventually intersects and extends below (from the perspective of FIG. 2) the mounting plane M. The wire insert axis 110 intersects the mounting plane M at an angle with respect to the interface between the base and the first printed circuit board 20. In this way, for example, the wire insert axis 110 can be easily accessed from the edge 12 of the card cage 14, without removing the second printed circuit board 22 (or another printed circuit board that can be arranged below the first printed circuit board). In addition, the design and configuration of the electrical terminal 100 can facilitate easy access to both the screw insert axis 108 and the wire insert axis 110 from the edge 12 of the card cage 14. That is, the screw insert axis 108 and the wire insert axis 110 can be sufficiently spaced from one another to allow, for example, a user to easily visualize the wire insert axis 110 while a screwdriver is inserted along the screw insert axis 108.

Figure 3:
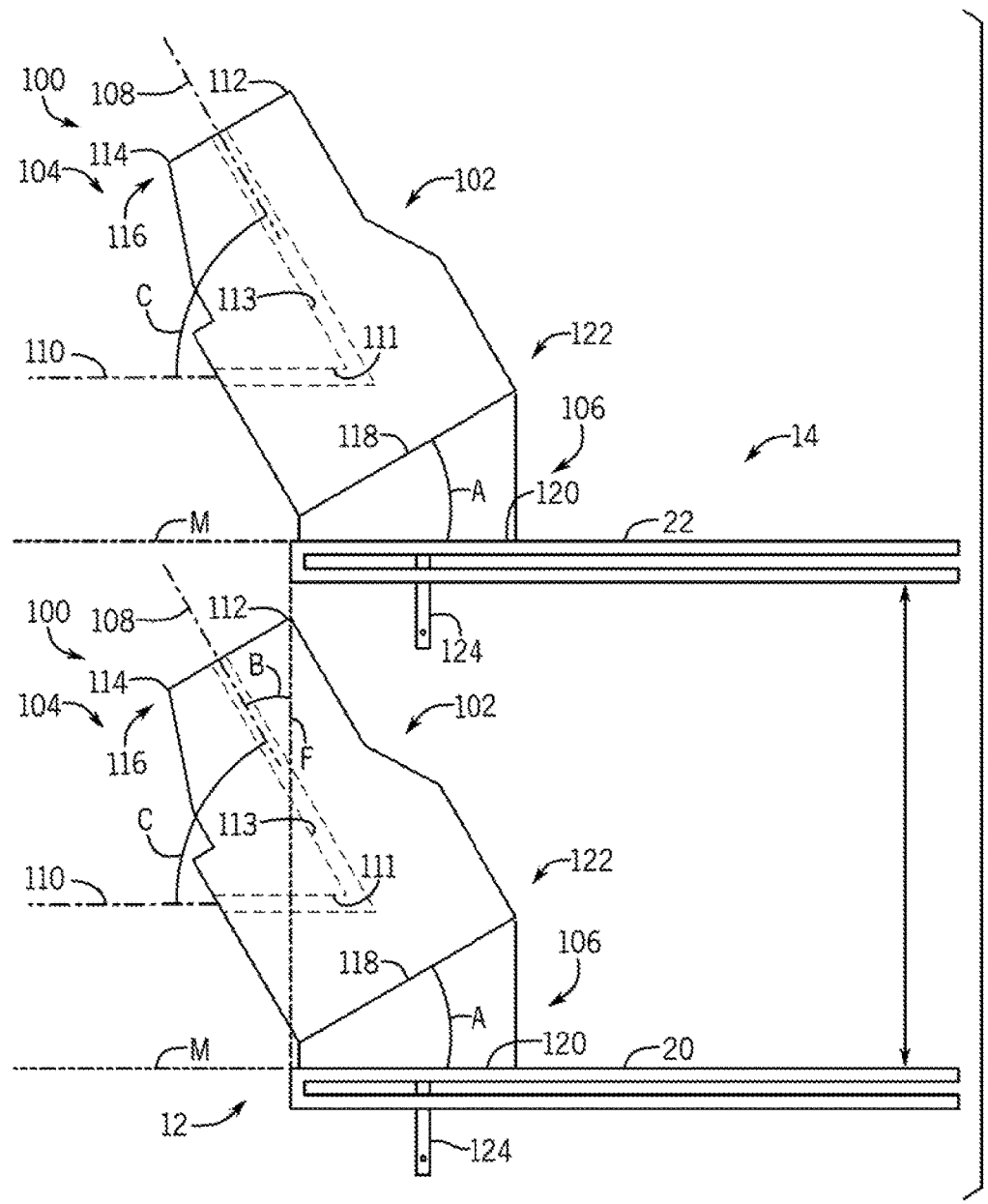
FIG. 3 is a side view of a card cage including electrical terminals having acutely angled cage clamps according to another embodiment of the invention.

In the illustrated embodiment of FIG. 2, the screw insert axis 108 can be arranged perpendicular to the wire insert axis 110. However, in other embodiments, the electrical terminal 100 can include a cage clamp that defines alternative arrangements between the screw insert axis 108 and the wire insert axis 110. As illustrated in FIG. 3, in some embodiments, an angle C between the screw insert axis 108 and the wire insert axis 110 can be less than ninety degrees. In some embodiments, the angle C between the screw insert axis 108 and the wire insert axis 110 can be an acute angle. In some embodiments, the angle C between the screw insert axis 108 and the wire insert axis 110 can be between approximately twenty degrees and approximately seventy degrees. In some embodiments, the angle C between the screw insert axis 108 and the wire insert axis 110 can be between approximately thirty degrees and approximately sixty degrees.

In some embodiments, the electrical terminal 100 can ensure that a height H between adjacent printed circuit boards within a card cage is maintained at a similar or smaller distance, when compared with conventional electrical terminals. Thus, embodiments of the electrical terminal 100 provide increased access to a cage clamp 104, without increased cost, size, or complexity.

It will be appreciated by those skilled in the art that while the invention has been described above in connection with particular embodiments and examples, the invention is not necessarily so limited, and that numerous other embodiments, examples, uses, modifications and departures from the embodiments, examples and uses are intended to be encompassed by the claims attached hereto. Various features and advantages of the invention are set forth in the following claims.

The invention claimed is:

1. An electrical terminal that provides wire termination at an edge of a printed circuit board, the electrical terminal comprising:
   a terminal body including a first corner;
   a cage clamp in the terminal body, the cage clamp defining a wire insert axis and a screw insert axis; and
   a base supporting the terminal body on the printed circuit board, the base being angled so that the first corner is aligned along a front plane defined along the edge of the printed circuit board.

2. The electrical terminal of claim 1, wherein the base includes an angled surface to support the terminal body and a mounting surface to engage the printed circuit board.

3. The electrical terminal of claim 1, wherein the terminal body and the base are a single component.

4. The electrical terminal of claim 1, wherein the terminal body and the base are separable components.

5. The electrical terminal of claim 1, wherein the terminal body includes the first corner and a second corner arranged at a distal end of the terminal body.

6. The electrical terminal of claim 5, wherein the screw insert axis extends between the first corner and the second corner.

7. The electrical terminal of claim 6, wherein the screw insert axis is at an acute angle relative to the front plane.

8. The electrical terminal of claim 1, and further comprising a pin extending from the base toward the printed circuit board, wherein the pin provides electrical communication between the cage clamp and the printed circuit board.

9. An electrical terminal that provides wire termination at an edge of a card cage, the card cage including a first printed circuit board and a second printed circuit board arranged above the first printed circuit board, the electrical terminal comprising:
   a terminal body including a first corner;
   a cage clamp in the terminal body, the cage clamp defining a wire insert axis and a screw insert axis; and
   a base supporting the terminal body on the first printed circuit board, the base being angled so that the screw insert axis is at an acute angle relative to a front plane defined along the edge of the card cage, and wherein the first corner is aligned with the front plane.

10. The electrical terminal of claim 9, wherein the base includes an angled surface to support the terminal body and a mounting surface to engage the first printed circuit board.

11. The electrical terminal of claim 10, wherein the wire insert axis extends from the terminal body and intersects a mounting plane at an angle with respect to an interface between the base and the first printed circuit board.

12. The electrical terminal of claim 9, wherein the terminal body and the base are a single component.

13. The electrical terminal of claim 9, wherein the terminal body and the base are separable components.

14. The electrical terminal of claim 9, and further comprising a pin extending from the base toward the first printed circuit board, wherein the pin provides electrical communication between the cage clamp and the first printed circuit board.

15. The electrical terminal of claim 9, wherein the terminal body includes the first corner and a second corner arranged at a distal end of the terminal body.

16. The electrical terminal of claim 15, wherein an angled surface of the base aligns the first corner along the front plane.

17. An electrical terminal that provides wire termination at an edge of a card cage, the card cage including a first printed circuit board and a second printed circuit board arranged above the first printed circuit board, the electrical terminal comprising:
   a terminal body including a first corner and a second corner arranged at a distal end thereof;
   a cage clamp in the terminal body, the cage clamp defining a wire insert axis and a screw insert axis, the screw insert axis extending into the terminal body in between the first corner and the second corner; and a base including an angled surface and a mounting surface, the angled surface supporting the terminal body, the mounting surface engaging the first printed circuit board, and the angled surface aligning the first corner along a front plane defined along the edge of the card cage.

18. The electrical terminal of claim 17, wherein the wire insert axis extends from the terminal body and intersects a mounting plane at an angle with respect to an interface between the base and the first printed circuit board.

19. The electrical terminal of claim 17, wherein the angled surface of the base arranges the screw insert axis at an acute angle relative to the front plane.

20. The electrical terminal of claim 17, and further comprising a pin extending from the base toward the first printed circuit board, wherein the pin provides electrical communication between the cage clamp and the first printed circuit board.

* * * * *